Sept. 28, 1965 J. D. MERRY 3,208,877
THERMOELECTRIC PANELS
Filed June 14, 1962

INVENTOR.
JACK D. MERRY.
BY Frank N. Decker Jr.
ATTORNEY.

3,208,877

THERMOELECTRIC PANELS

Jack D. Merry, East Syracuse, N.Y., assignor to Carrier Corporation, Syracuse, N.Y., a corporation of Delaware Filed June 14, 1962, Ser. No. 202,491
3 Claims. (Cl. 136—4)

This invention relates to thermoelectric panels and, more particularly, to means for maintaining desired pressures between the components of a thermoelectric panel so as to obtain desired electrical and thermal conductivity between the panel components.

A variety of thermoelectric panel structures have been evolved permitting the application of either Peltier or Seebeck effects to obtain either desired heat pumping or electrical generation, respectively. Where theremoelectric panels are utilized, the heat absorbing portions of the panel are often subject to relatively high temperatures. In producing commercially operative panels for the generation of electricity, the panel is designed to accommodate temperature differentials between the heat absorbing and heat dissipating sides of the panel of more than 1000° F. This temperature differential between opposite sides of the relatively thin panel results in the panel components being subjected to considerable stress and distortion.

In addition, connections between the panel components are subject to severe heat stresses due to differential thermal expansion, and it has been found desirable to minimize the use of bonding agents such as soldering, welding, brazing, since the use of these bonding agents increases the possibility of breakdown. Particularly in the heat absorbing sections of the thermoelectric panel, a simple pressure contact electrical connection is found to give optimum results. As is apparent, in order to obtain desired pressure contact, there must be some means for insuring the exertion of sufficient uniform force between the components to be connected, during the entire operative range of temperatures.

It is accordingly a primary object of this invention to provide a thermoelectric panel including improved means for exerting desired uniform pressure between the components of the panel.

These and other objects of the invention which will become hereafter apparent are attained in one embodiment by provision of a thermoelectric panel with either its heat absorbing or heat dissipating plate formed of a flexible material. At a spaced distance from this flexible plate, a relatively rigid housing plate is arranged, and between the relatively rigid housing plate and the relatively flexible heat transfer plate a resilient pad formed of an elastomeric material such as rubber or the like is arranged. In a preferred embodiment of the invention, this resilient pad bears up against an extended heat transfer surface element which bears against the flexible heat transfer plate. Thus pressures exerted by the resilient pad may readily be transferred to the flexible plate, and any member contacting same. Assembly of the resilient pads with respect to the panel may be accomplished by utilizing readily available bonding agents between the pad and the enclosure plate, and the pad and the extended heat transfer surface element.

The specific details of a preferred embodiment of the invention, and their mode of functioning will become apparent by reference to the following description and the accompanying drawing, wherein.

Figure 1:
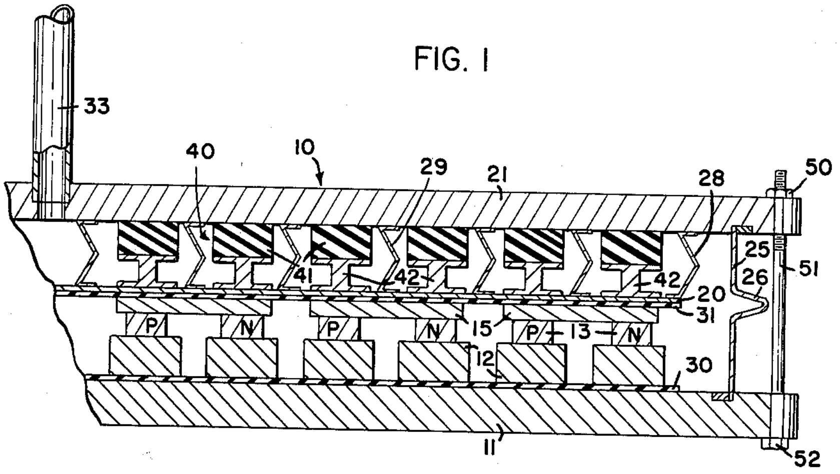
FIGURE 1 is a schematic cross-sectional view through a panel embodying the instant inventive concept.

Thermoelectric panel 10 shown in FIGURE 1 may be utilized for the generation of electricity and comprises a first relatively rigid heat resistant plate member 11 formed of an alloy of iron, nickel and cobalt such as Inconel or the like material suitable for use at high temperatures. Plate 11 is adapted to be heated by a suitable heat source (not shown) such as a fuel burner. Arranged in heat exchange relationship with heated plate 11 are adjacent heat absorbing bridges 12 formed of iron or the like. A layer of suitable electrical insulation 30, such as mica, is disposed between plate 11 and bridges 12. Thermoelectric elements 13 of different thermoelectric characteristics are electrically connected by bridges 12. The thermoelectric elements will here be referred to as 13 P and 13 N, it being understood that the P and N may refer respectively to semi-conductor elements having P and N type electrical conductivity characteristics.

Relatively cool or heat dissipating junctions are formed between the thermoelectric elements 13 and copper bridges 15. At these heat dissipating junctions, temperatures are sufficiently low so that bridges 15 may be soldered to the thermoelectric elements 13 without danger of the solder melting or diffusing into the thermoelectric elements during operation. A flexible heat sink, second plate member 20, formed of a highly conductive corrosion resistant material such as annealed stainless steel, is arranged in heat transfer relationship with the heat dissipating bridges 15. Heat sink plate 20 is electrically insulated from bridge 15 by the use of a sheet 31 of suitable insulating material such as mica having relatively high heat conductivity but low electrical conductivity.

A water jacket is formed above the heat sink plate 20 by utilizing a third rigid enclosure plate member 21 which is coupled to heat source plate 11 by means of a side panel gas seal 25. Gas seal 25 preferably has an expansion joint 26 formed therein. A seal 28 is similarly formed between enclosure plate 21 and flexible heat sink plate 20 so as to provide a jacket to permit water or other coolant to be employed for heat dissipation. Plate member 21, side panel 28 and conduit walls 29 provide means to circulate a cooling fluid in heat exchange relation with the thermoelectric junctions to be cooled adjacent plate 20, suitable means 33 is provided for passing the cooling medium into the jacket for this purpose and suitable means (not shown) is provided for discharging the cooling medium therefrom.

Figure 2:
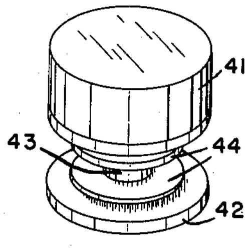
FIGURE 2 is a perspective view of a modified form of the pressure applying assembly including a pad and a heat transfer member of the type shown in FIGURE 1.

Within the coolant jacket between enclosure plate 21 and heat sink plate 20 are arranged a plurality of flexible pressure applying assemblies 40. Assembly 40, as illustrated in FIGURE 2, may comprise a compressible, cylindrical, resilient, elastomeric, pad member 41 formed of rubber or the like material having a low compression set and relatively good resistance to chemical attack and swell by water. Elastomeric materials, such as chloroprene, tested in accordance with ASTM standard D395B, having a compression set of less than 30% after 70 hours at 212° F., and having a Shore A durometer hardness of between 50 and 80 have been found to be satisfactory.

Pressure applying assemblies 40 are also provided with rigid, extended, heat transfer surface elements 42 formed of a material of high heat conductivity such as copper-nickel arranged beneath each resilient pad. The heat transfer element 42 shown has a spool shaped configuration with a reduced diameter shank 43 to avoid overheating of resilient members 41, but it will be appreciated that any suitable form may be utilized to provide an extended heat transfer surface. For example, cylindrical fins 44 may be provided on the reduced shank of spool members 42 to increase heat transfer from the thermoelectric junctions to be cooled adjacent flexible plate member 20.

Figure 3:
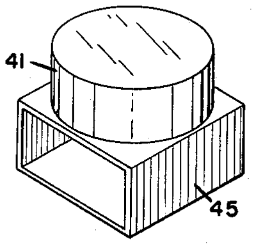
FIGURE 3 is a view of an alternative embodiment of the pressure applying assembly employing another form of extended surface element.

A modified heat transfer surface element 45 is shown in FIGURE 3 having a hollow box section instead of spools 42.

Suitable fastening means such as an assembly bolt 51 having a head 52 and a nut 50 is utilized to maintain the panel in assembled relationship. By tightening nut 50, desired pressures may be developed to compress the pad means 41 in order to provide pressure to maintain electrical contact between heated bridges 12 and their associated thermoelectric elements 13.

The components of the novel pressure applying assemblies 40 may be bonded together by the use of conventional bonding agents such as rubber cement or the like depending on the material of the resilient pads 41. In manufacture, resilient pads 41 may be similarly bonded to the enclosure plate 21 during assembly. The assembled enclosure plate and pressure assemblies are then conjoined with the other components of the panel 10 with nuts 50 being tightened on bolt 51 to exert sufficient pressure on the resilient pads 41 so as to obtain the desired pressure between heat source plate 11, bridges 12, thermoelectric elements 13 and between bridges 12, and heat sink plate 20.

In use as a thermoelectric generator, panel 10 is arranged with its heat source panel 11 in heat exchange relationship with a source of heat such as an oil burner flame or a suitable heat exchanger. Water or other cooling medium is passed through the jacket formed between enclosure plate 21 and flexible heat sink plate 20. As a result of the temperature difference between the heat source plate 11 and the heat sink plate 20, bridges 12 and 15 which are in heat exchange relationship with said plates are maintained at a difference in temperature. In accordance with the Seebeck effect, the temperature differential produces a flow of direct current through the thermoelectric elements.

The temperature difference at various points in the panel structure results in differential distortions of the panel components due to unequal thermal expansion. Since the contact between bridges 12 and thermoelectric elements 13 is purely a pressure contact, any distortions of the components must be accommodated, and compensated for and this is achieved by the resiliency of pressure assembly 40. Resilient pads 41 exert a substantially uniform pressure on the thermoelectric elements and their asociated bridges to maintain good electrical contact therebetween regardless of differential thermal expansion of the panel components in either a lateral or an axial direction. The use of the extended heat transfer surface member 42 or 45 serves the functions of applying the pressure exerted by the resilient pad directly over the thermoelectric element, and simultaneously increasing the rate of heat transfer from the heat sink plate 20 to the coolant circulating in the jacket. It also protects the elastomeric member from thermal decomposition due to excess heating which might cause depolymerization. For this purpose, one or more fins 44 may be added to the heat transfer member. The reduced area shank portion 43 of member 42 in FIGURE 2, or the extended heat conduction path 45 of member 42 in FIGURE 3 further serves to reduce the temperature gradient across the elastomeric member which might result in adverse thermal decomposition.

It is thus seen that a simple effective thermoelectric panel has been provided having means for maintaining desired pressures in a thermoelectric panel to effect necessary pressure contact between panel components during a wide range of temperature differences to maintain the integrity of the pressure contacts which form some of the thermoelectric junctions.

The above disclosure has been given by way of illustration and it will be appreciated that the invention may be otherwise embodied within the scope of the appended claims.

I claim:

1. A thermoelectric panel comprising:

a first, relatively rigid, plate;

a second, relatively rigid, plate secured in spaced relation with said first plate;

a relatively flexible plate disposed between and in spaced relation with said first and second rigid plates;

a plurality of thermoelectric elements, having dissimilar thermolelectric power, connected to form thermoelectric junctions of differing types, disposed between said first rigid plate and said flexible plate, so that junctions of one type are each disposed adjacent said one rigid plate and junctions of another type are each disposed adjacent said flexible plate;

electrical insulation means disposed between said thermoelectric elements and said first plate and between said thermoelectric elements and said flexible plate;

a plurality of compressed elastomeric pressure applying pad members disposed between said second rigid plate and said flexible plate bearing against said second plate;

a plurality of heat conducting, rigid, extended, heat tranfer elements, each of said heat transfer elements being secured in engagement with one of said elastomeric pad members, said heat transfer members bearing against said flexible plate to transmit the compressive force exerted by said compressed elastomeric pad member to said thermoelectric elements, thereby adapting to thermal changes in said thermoelectric panel; and passage means to pass a cooling fluid through the space between said second rigid plate and said flexible plate in contact with said extended heat transfer members, to inhibit the passage of heat from said flexible plate to said elastomeric pads.

2. A thermoelectric panel as defined in claim 1 wherein said extended heat transfer elements comprise spool members having a laterally extending fin.

3. A thermoelectric panel as defined in claim 1 wherein said extended heat transfer elements comprise hollow box-like members.

References Cited by the Examiner

UNITED STATES PATENTS

| | | | |
|---|---|---|---|
| 3,006,979 | 10/61 | Rich | 136—4.2 |
| 3,082,275 | 3/63 | Talaat | 136—4 |
| 3,111,432 | 11/63 | Sickert et al. | 136—4 |

WINSTON A. DOUGLAS, *Primary Examiner.*

JOHN H. MACK, *Examiner.*